(12) United States Patent
Zang et al.

(10) Patent No.: US 9,171,922 B1
(45) Date of Patent: Oct. 27, 2015

(54) COMBINATION FINFET/ULTRA-THIN BODY TRANSISTOR STRUCTURE AND METHODS OF MAKING SUCH STRUCTURES

(71) Applicant: GLOBALFOUNDRIES Inc., Grand Cayman (KY)

(72) Inventors: Hui Zang, Guilderland, NY (US); Bingwu Liu, Ballston Spa, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/329,263

(22) Filed: Jul. 11, 2014

(51) Int. Cl.
| | | |
|---|---|---|
| H01L 27/01 | (2006.01) |
| H01L 21/338 | (2006.01) |
| H01L 29/423 | (2006.01) |
| H01L 27/088 | (2006.01) |
| H01L 29/66 | (2006.01) |

(52) U.S. Cl.
CPC ...... *H01L 29/42392* (2013.01); *H01L 27/0886* (2013.01); *H01L 29/66795* (2013.01)

(58) Field of Classification Search
CPC ............... H01L 27/0886; H01L 29/42392; H01L 27/66795; H01L 27/785; H01L 27/7856
USPC .......... 438/285, 425, 167, 216, 275; 257/347, 257/368
See application file for complete search history.

(56) References Cited

U.S. PATENT DOCUMENTS

| | | | |
|---|---|---|---|
| 8,768,271 B1* | 7/2014 | Then et al. ............... | 455/91 |
| 8,981,479 B2* | 3/2015 | Wang et al. ............... | 257/347 |
| 2013/0249003 A1* | 9/2013 | Oh et al. ................... | 257/347 |
| 2014/0248751 A1* | 9/2014 | Cheng et al. ............. | 438/285 |
| 2015/0129979 A1* | 5/2015 | Lee et al. .................. | 257/401 |

* cited by examiner

*Primary Examiner* — Kevin M Picardat
(74) *Attorney, Agent, or Firm* — Amerson Law Firm, PLLC

(57) ABSTRACT

One illustrative device disclosed herein includes, among other things, an active layer positioned above a layer of insulating material, a fin positioned above the active layer, a gate insulation layer positioned on the active layer and on the fin, a conductive gate structure that is positioned around at least a portion of the fin and above at least a portion of the active layer, wherein the conductive gate structure comprises at least one work function adjusting metal layer positioned on the gate insulation layer, a first channel region defined in the fin under the conductive gate structure, and a second channel region defined in the active layer under the conductive gate structure.

18 Claims, 15 Drawing Sheets

COMBINATION FINFET/ULTRA-THIN BODY TRANSISTOR STRUCTURE AND METHODS OF MAKING SUCH STRUCTURES

BACKGROUND OF THE INVENTION

1. Field of the Invention

The present disclosure generally relates to the fabrication of integrated circuits, and, more particularly, to various embodiments of a combination FinFET/Ultra-Thin Body (UTB) transistor device and various methods of making such devices.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reduced feature sizes of circuit elements, such as transistors. However, the ongoing demand for enhanced functionality of electronic devices forces semi-conductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Typically, a high performance integrated circuit product, such as a high performance microprocessor, will contain billions of individual field effect transistors (FETs). The transistors are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region of the transistor. The transistor devices come in a variety of forms, e.g., so-called planar transistor devices, 3D or FinFET devices, ultra-thin body (UTB) devices, etc.

FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes a plurality of trenches 14 that define three illustrative fins 16, a gate structure 18, sidewall spacers 20 and a gate cap layer 22. FIG. 1B is a cross-sectional view of the FinFET device 10 taken through the gate structure 18 in a gate width direction of the device 10. The gate structure 18 is typically comprised of a layer of gate insulating material 18A (see FIG. 1B), e.g., a layer of high-k insulating material (k-value of 10 or greater) or silicon dioxide, and one or more conductive material layers (e.g., metal and/or polysilicon) that serve as the gate electrode 18B (see FIG. 1B) for the device 10. The fins 16 have a three-dimensional configuration: a height H, a width W and an axial length L. The axial length L of the fins 16 corresponds to the direction of current travel in the device 10 when it is operational. The portions of the fins 16 covered by the gate structure 18 are the channel regions of the FinFET device 10. In a conventional process flow, the portions of the fins 16 that are positioned outside of the spacers 20, i.e., in the source/drain regions of the device 10, may be increased in size or even merged together (a situation not shown in FIG. 1A) by performing one or more epitaxial growth processes. In the FinFET device, the gate structure 18 may enclose both the sides and the upper surface of all or a portion of the fins 16 to form a tri-gate structure, i.e., a channel having a three-dimensional structure instead of a planar structure. In some cases, an insulating cap layer (not shown), e.g., silicon nitride, is positioned at the top of the fins 16 and the FinFET device only has a dual-gate structure (sidewalls only). Unlike a planar FET, in a FinFET device, a channel is formed perpendicular to a surface of the semiconducting substrate 12 so as to reduce the physical size of the semiconductor device. The gate structures 18 for such FinFET devices 10 may be manufactured using so-called "gate-first" or "replacement gate" (gate-last) manufacturing techniques. Although the FinFET device 10 is a superior structure as compared to a planar transistor device, it does have some limitations. For example, with reference to FIG. 1B, the height of the fins 16 covered by the isolation material 24, as indicated by the dimension 16x, is effectively wasted and does not make any contribution to the drive current of the device 10.

FIG. 1C is a simplistic cross-sectional view of an illustrative UTB device 30 that is formed above a substrate 12. In general, the UTB device 30 is comprised of a layer of insulation material 32, a very thin (e.g., up to 15 nm or so) active semiconductor layer 34, a gate insulation layer 36, a gate electrode 38, sidewall spacers 39, a gate cap layer 40 and illustrative raised source/drain regions 42.

What is needed for future integrated circuit products is a new transistor structure that provides a relatively high drive current per area of substrate used to make the device, i.e., a higher drive current density that may be readily manufactured in a high-volume VLSI production environment. The present disclosure is directed to various embodiments of a combination FinFET/Ultra-Thin Body (UTB) transistor device and various methods of making such devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a combination FinFET/Ultra-Thin Body (UTB) transistor device and various methods of making such devices. One illustrative device disclosed herein includes, among other things, an active layer positioned above a layer of insulating material, a fin positioned above the active layer, a gate insulation layer positioned on the active layer and on the fin, a conductive gate structure that is positioned around at least a portion of the fin and above at least a portion of the active layer, wherein the conductive gate structure comprises at least one work function adjusting metal layer positioned on the gate insulation layer, a first channel region defined in the fin under the conductive gate structure, and a second channel region defined in the active layer under the conductive gate structure.

One illustrative method is generally directed to forming a device in a structure comprising first, second and third layers of semiconductor materials positioned above a layer of insulating material. In one example, the method includes, among other things, forming a plurality of trenches in at least the third layer of semiconductor material to thereby define a fin from the third layer of semiconductor material, wherein the trenches expose the second layer of semiconductor material, performing an etching process to selectively remove the second layer of semiconductor material relative to the first layer of semiconductor material and the fin, forming a gate insulation layer on the fin and on the first layer of semiconductor material, and forming a conductive gate structure around at least a portion of the fin and above at least a portion of the first layer of semiconductor material, wherein the conductive gate structure comprises at least one work function adjusting metal layer positioned on the gate insulation layer and wherein a first channel region is defined in the fin under the conductive gate structure and a second channel region is defined in the first layer of semiconductor material under the conductive gate structure.

BRIEF DESCRIPTION OF THE DRAWINGS

The disclosure may be understood by reference to the following description taken in conjunction with the accompanying drawings, in which like reference numerals identify like elements, and in which:

FIG. 1C is a cross-sectional view of a simplistically depicted prior art Ultra-Thin Body (UTB) device;

Figure 1A:
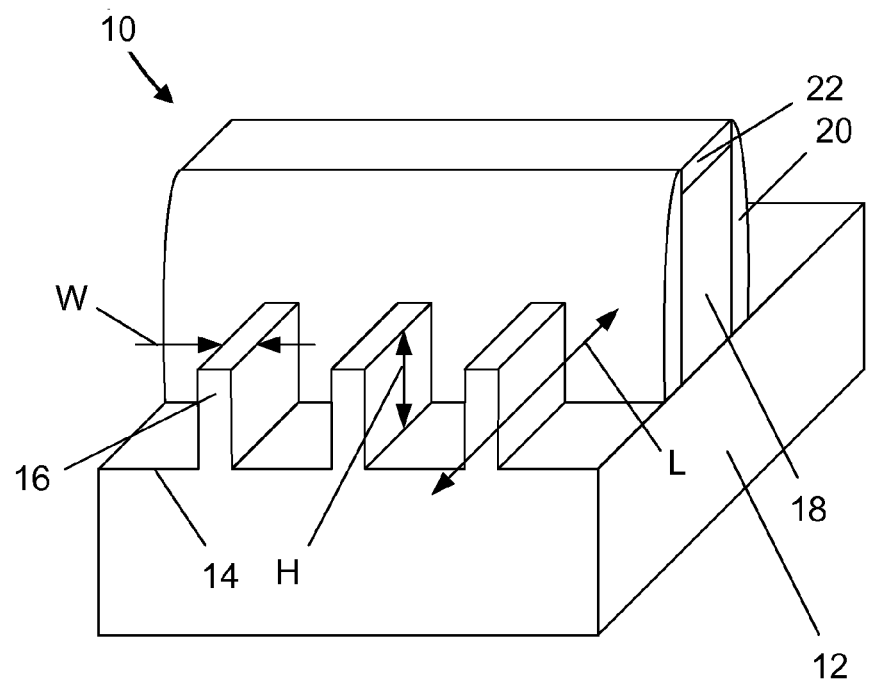
FIGS. 1A-1B are, respectively, a perspective and cross-sectional view of a simplistically depicted prior art FinFET device.
Figure 1B:
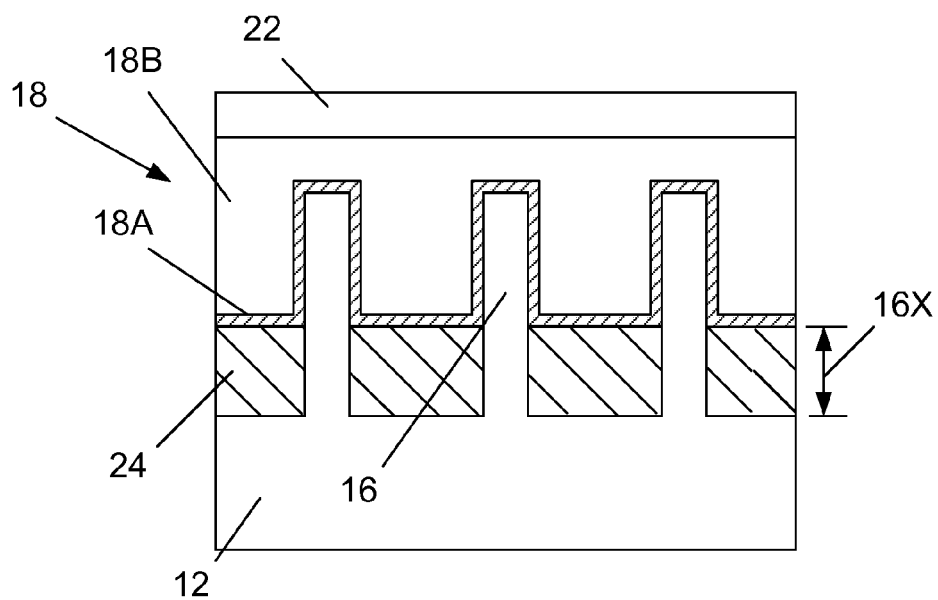

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various embodiments of a combination FinFET/Ultra-Thin Body (UTB) transistor device and various methods of making such devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Additionally, various doped regions, e.g., halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2A:
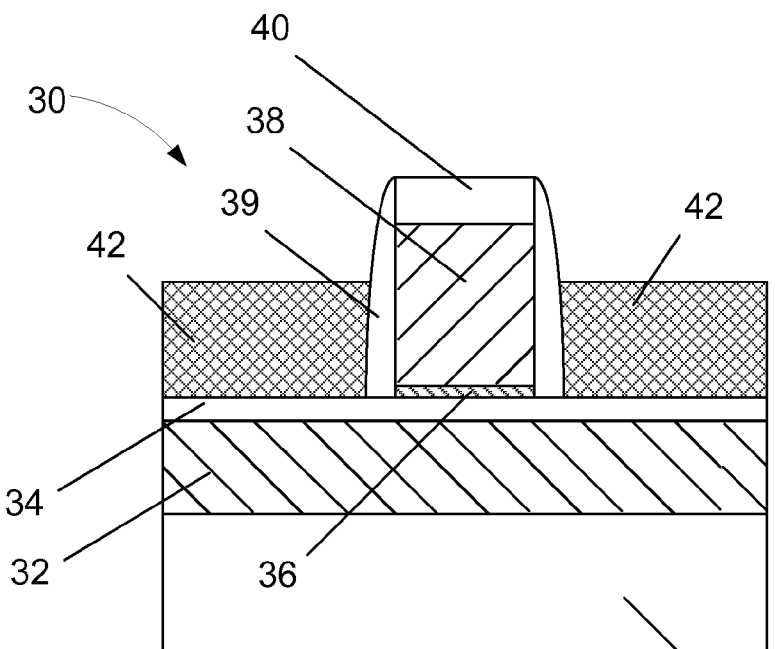
FIGS. 2A-2Q depict various embodiments of a combination FinFET/Ultra-Thin Body (UTB) transistor device and various methods of making such devices.
Figure 2A:
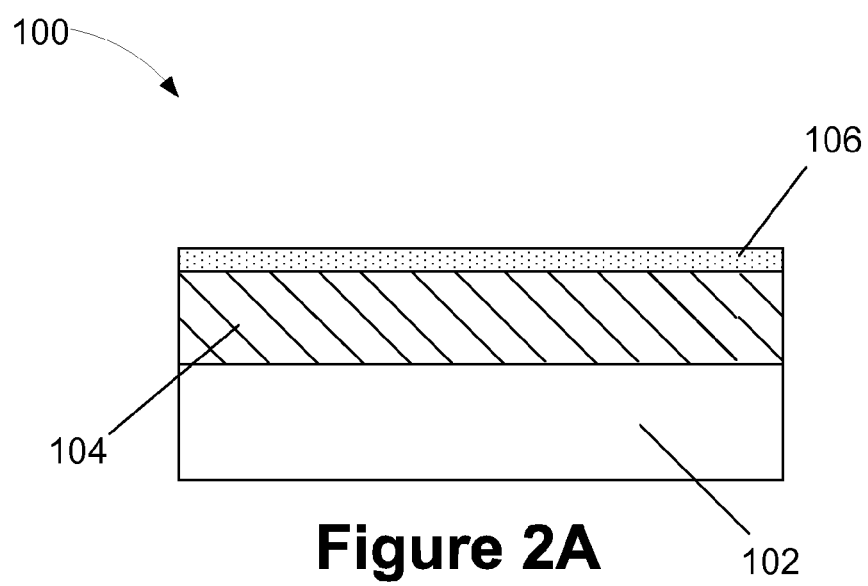
Figure 2B:
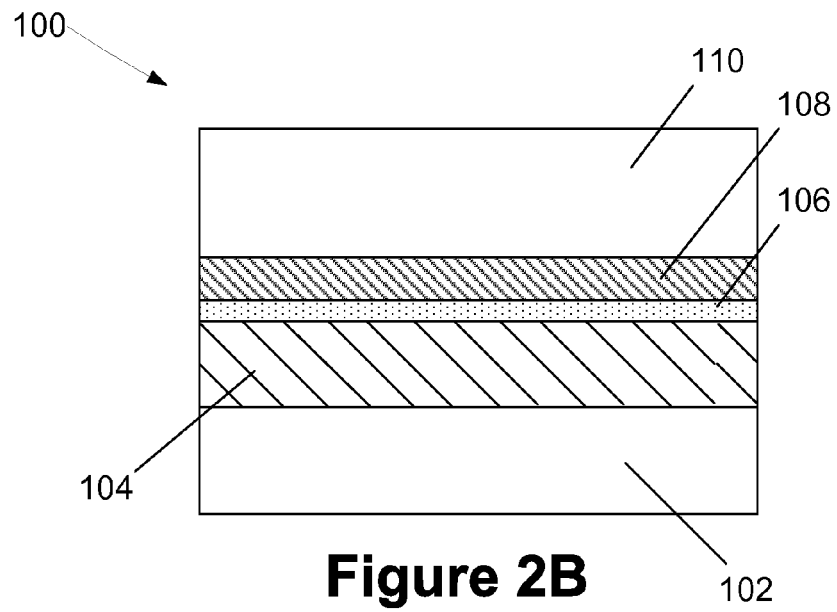
Figure 2C:
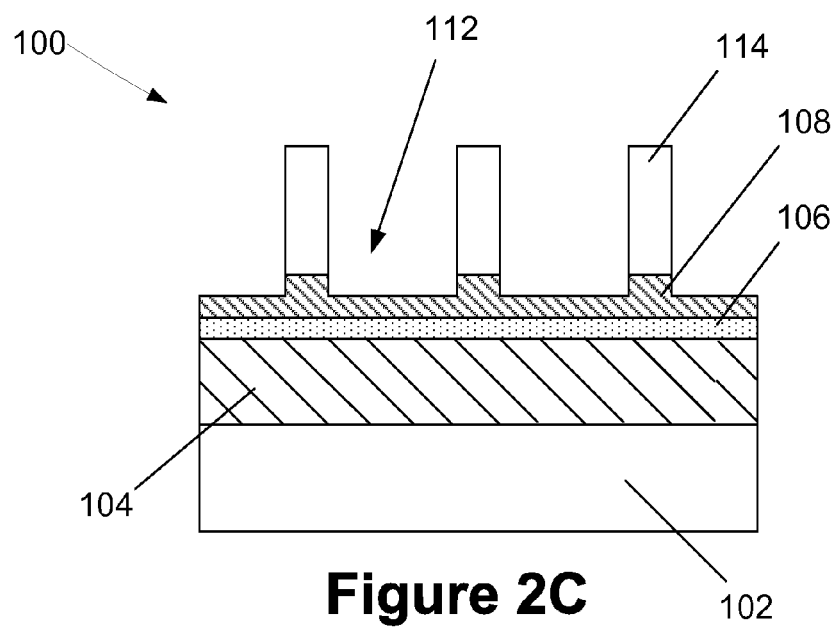
Figure 2D:
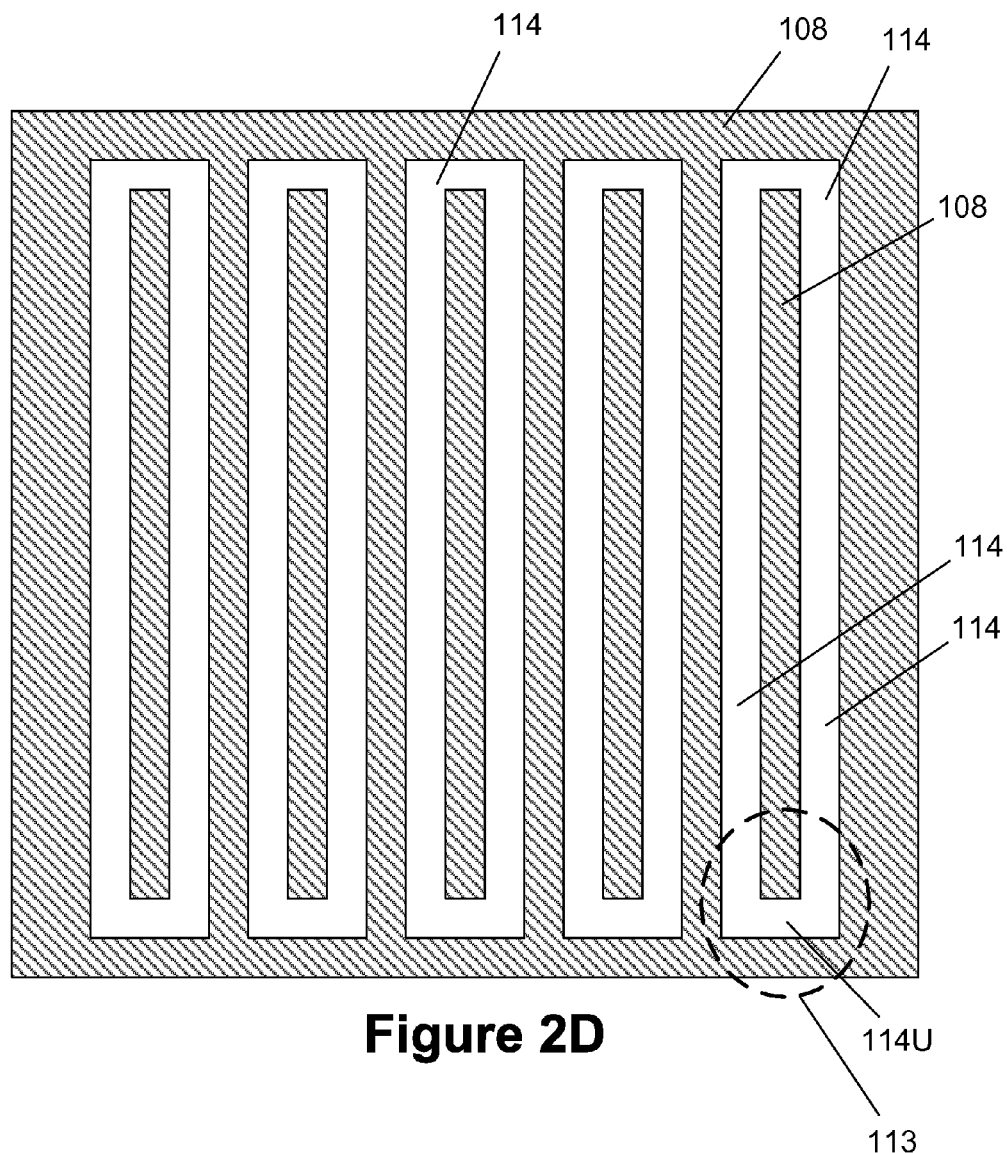
Figure 2E:
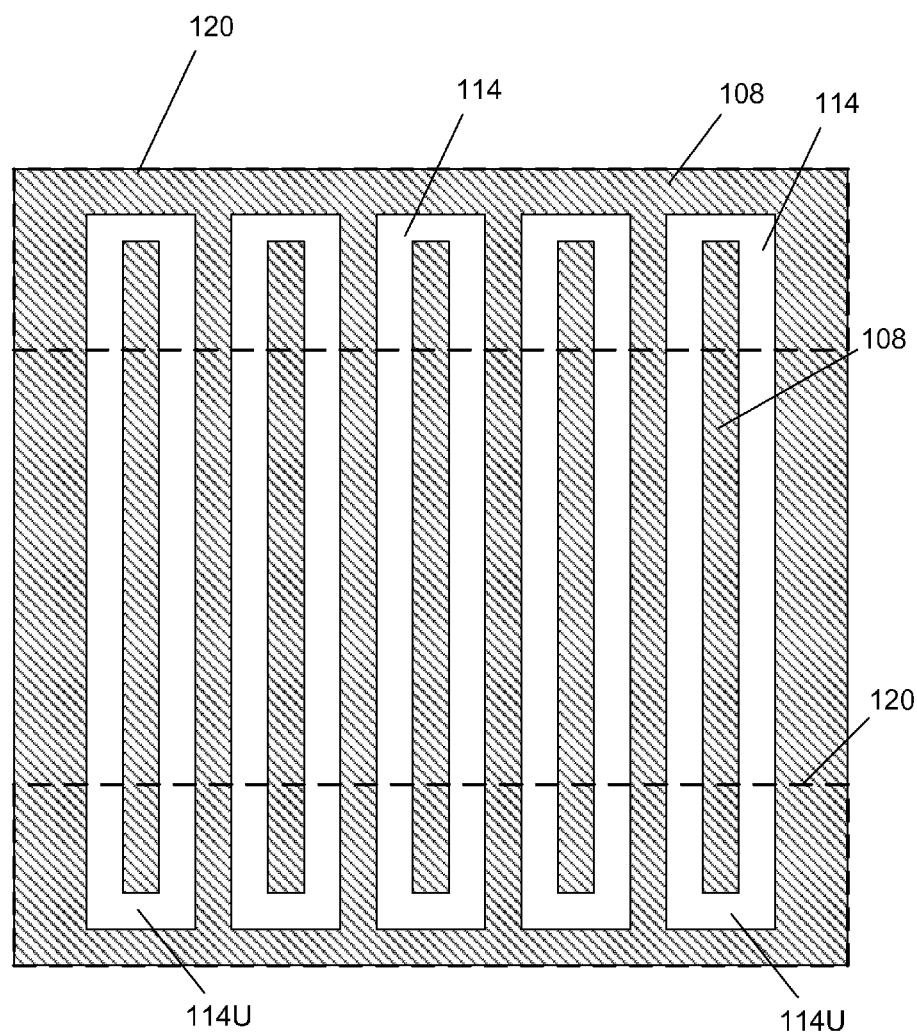
Figure 2F:
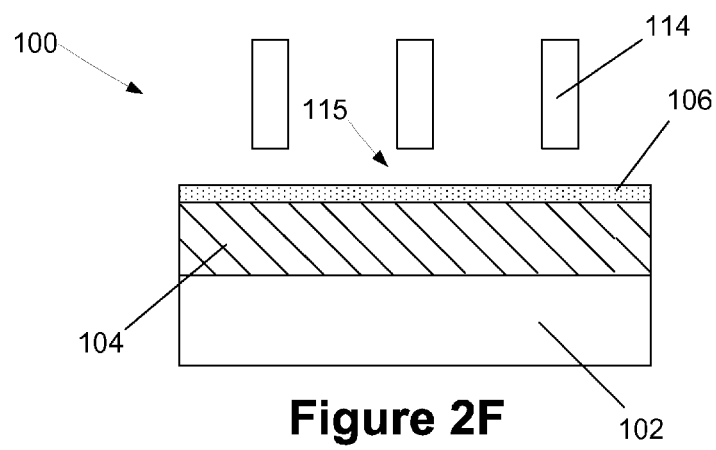
Figure 2G:
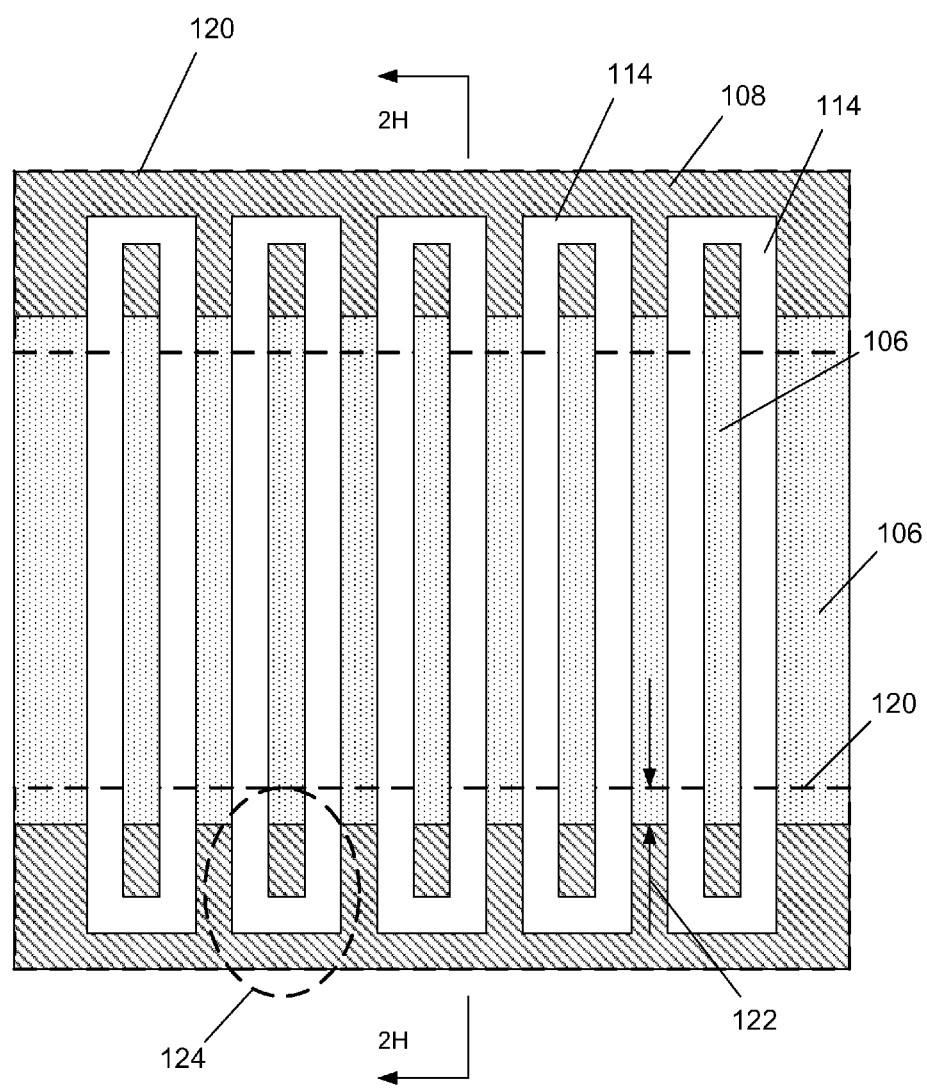
Figure 2H:
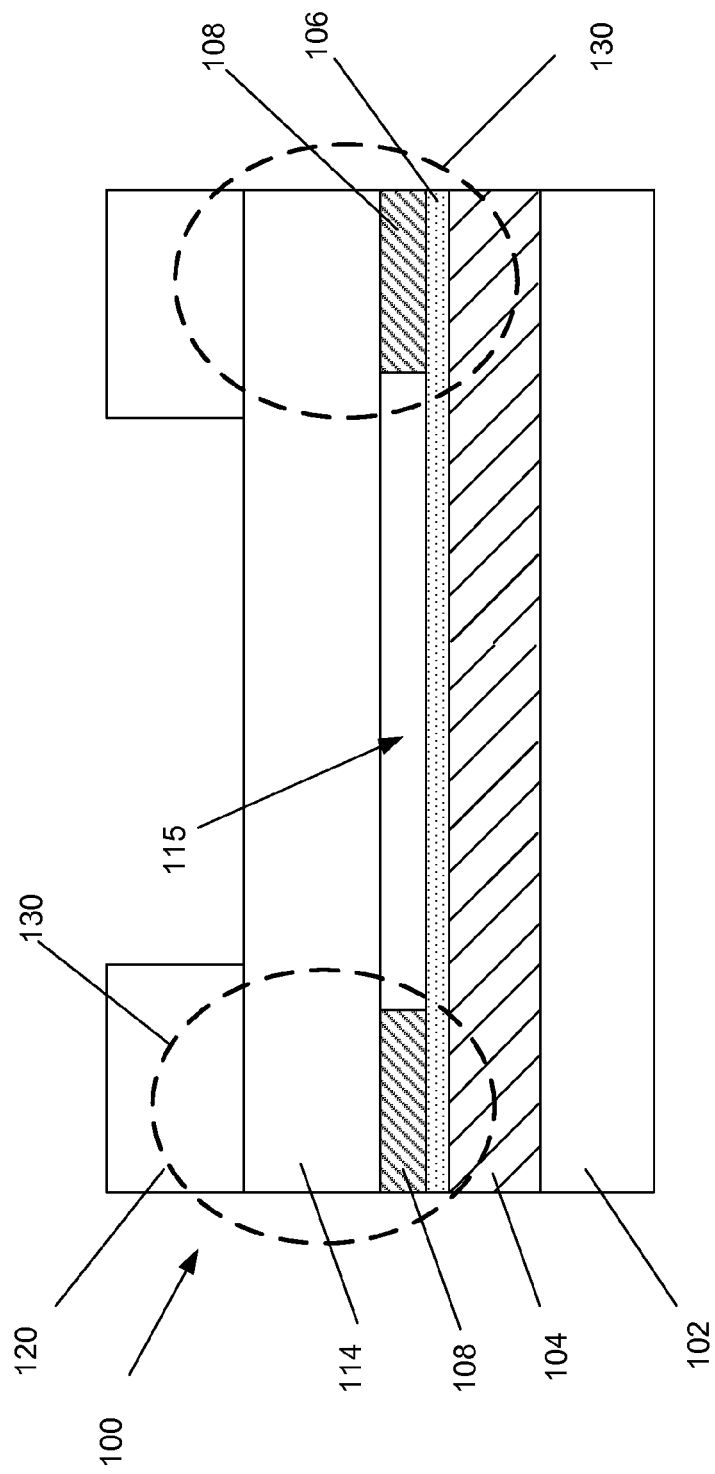
Figure 2I:
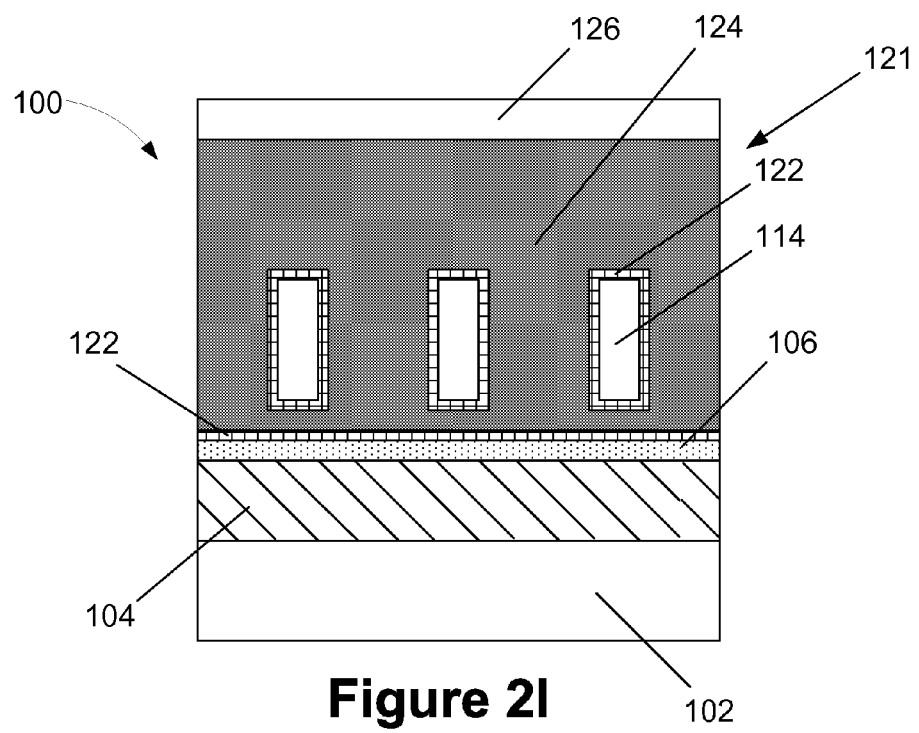
Figure 2J:
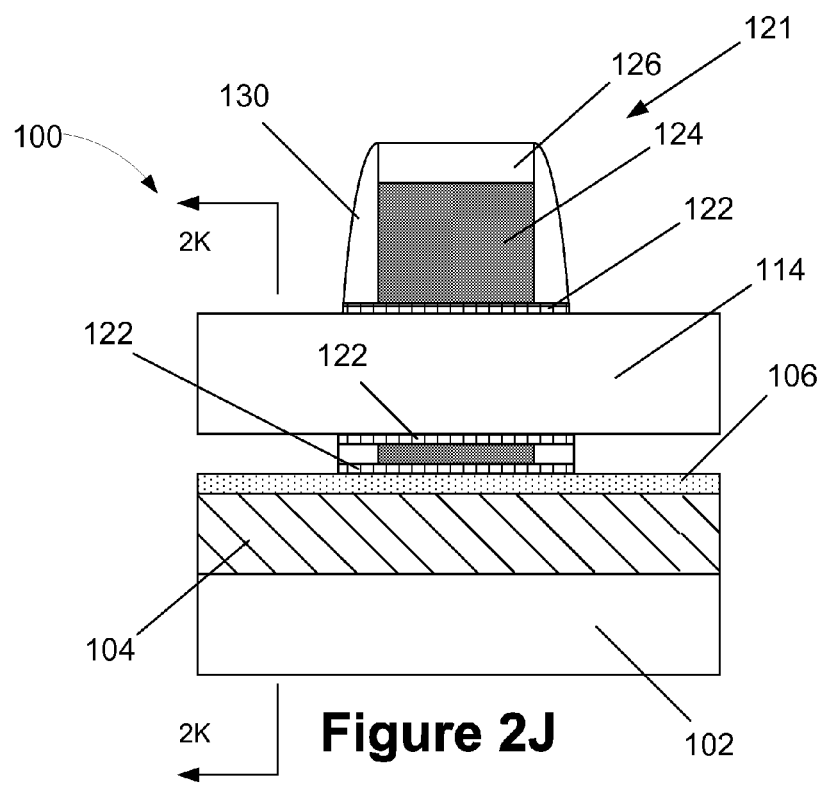
Figure 2K:
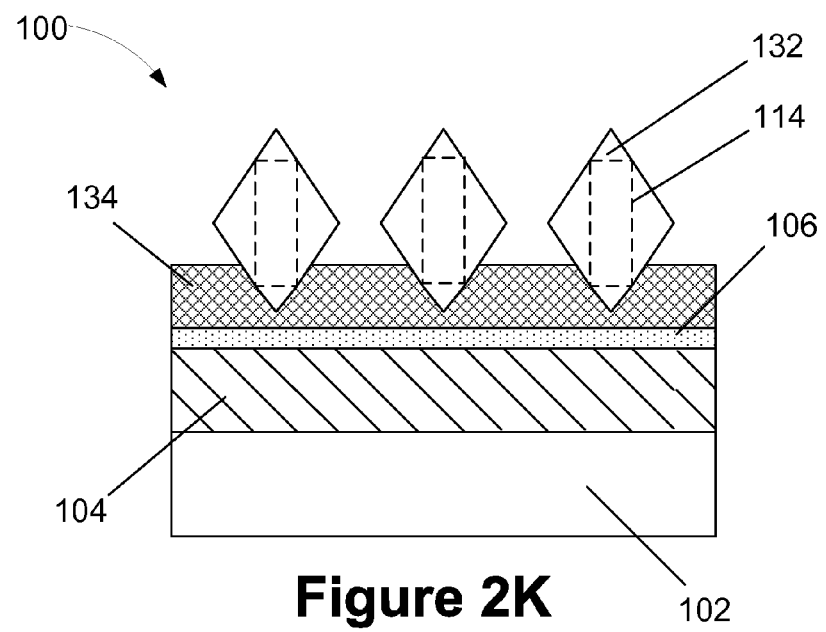
Figure 2L:
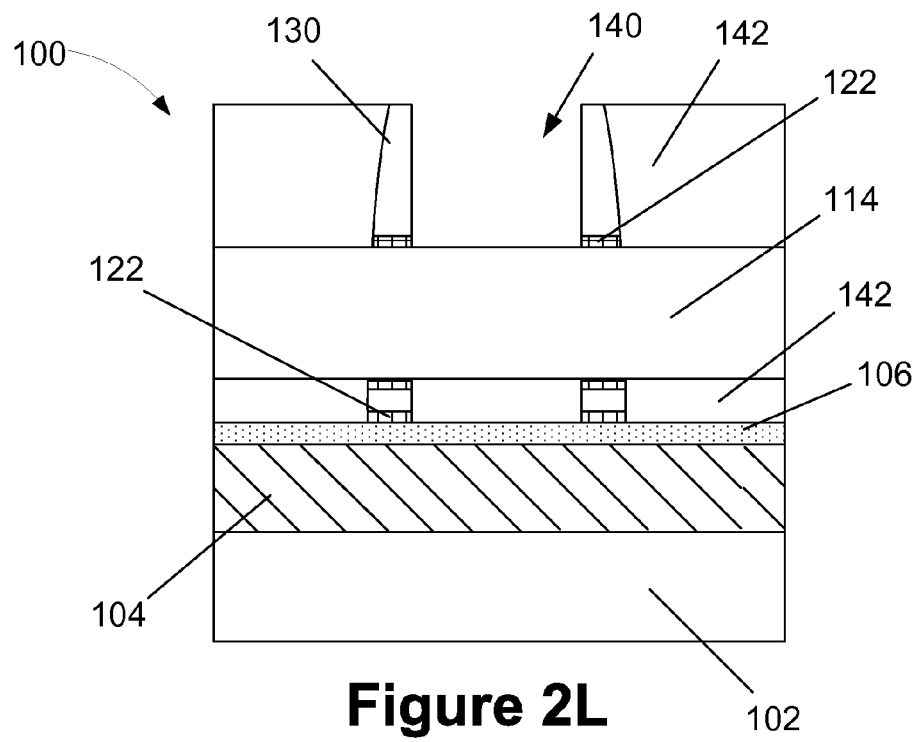
Figure 2M:
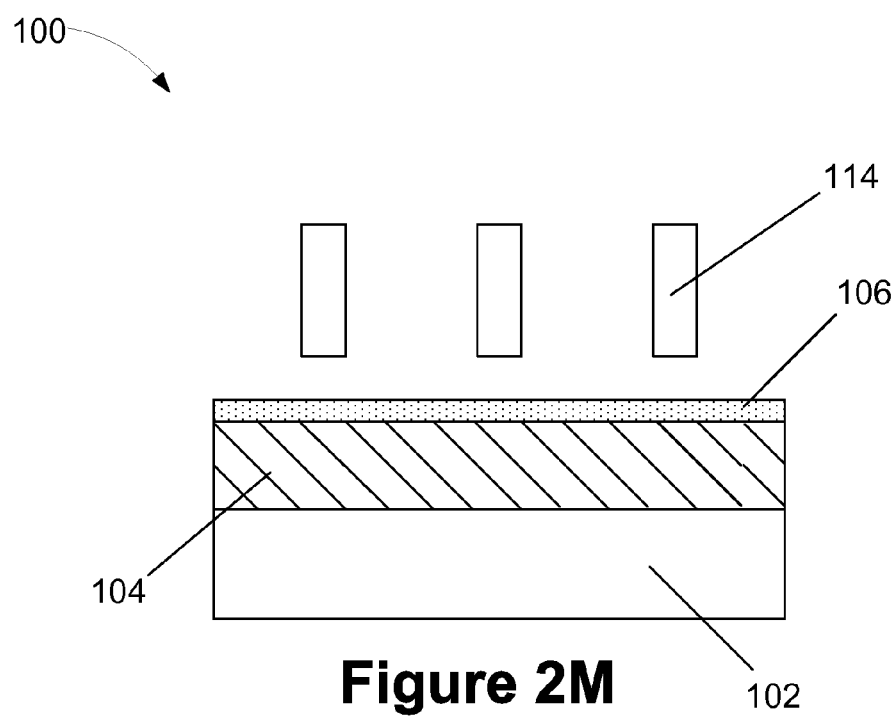
Figure 2N:
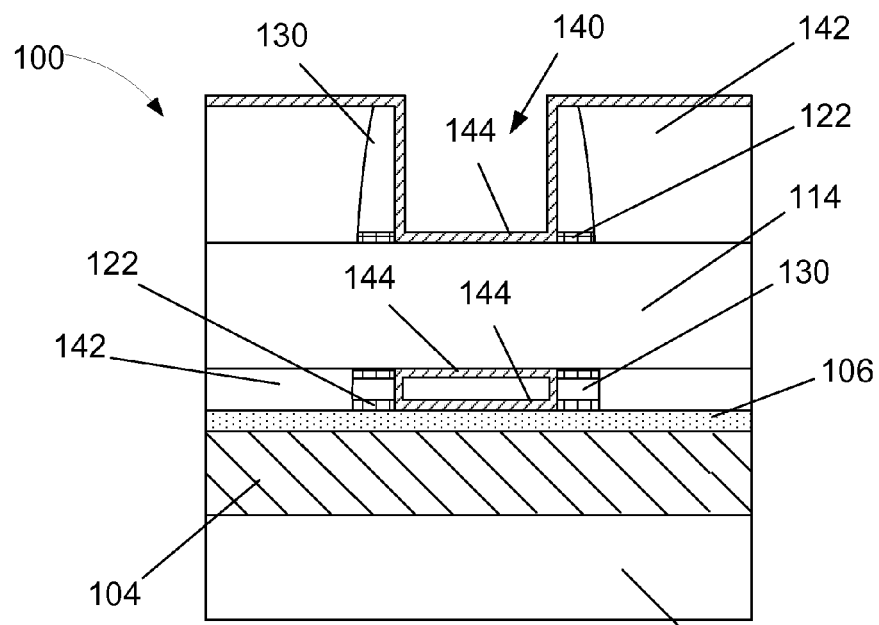
Figure 2O:
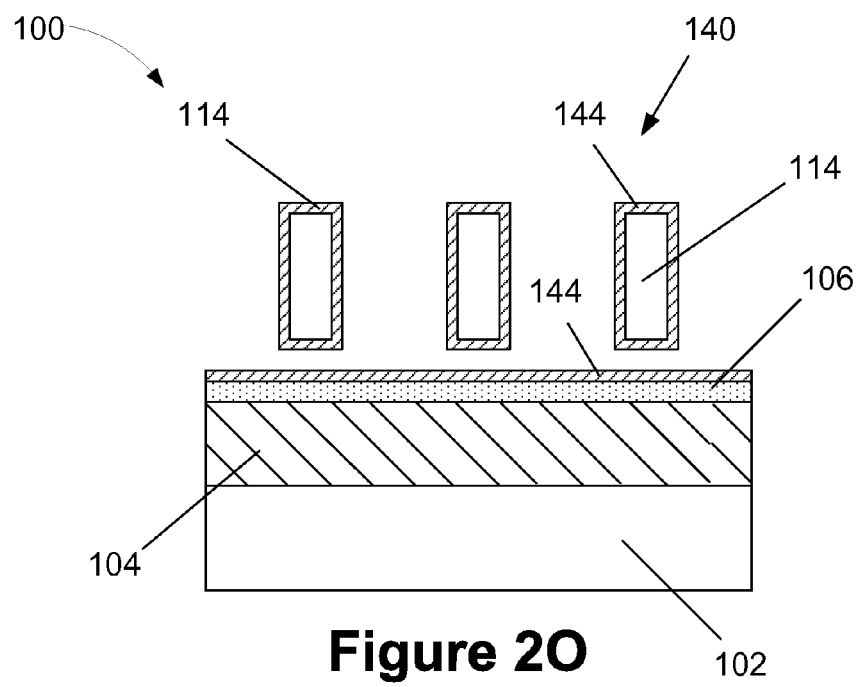
Figure 2P:
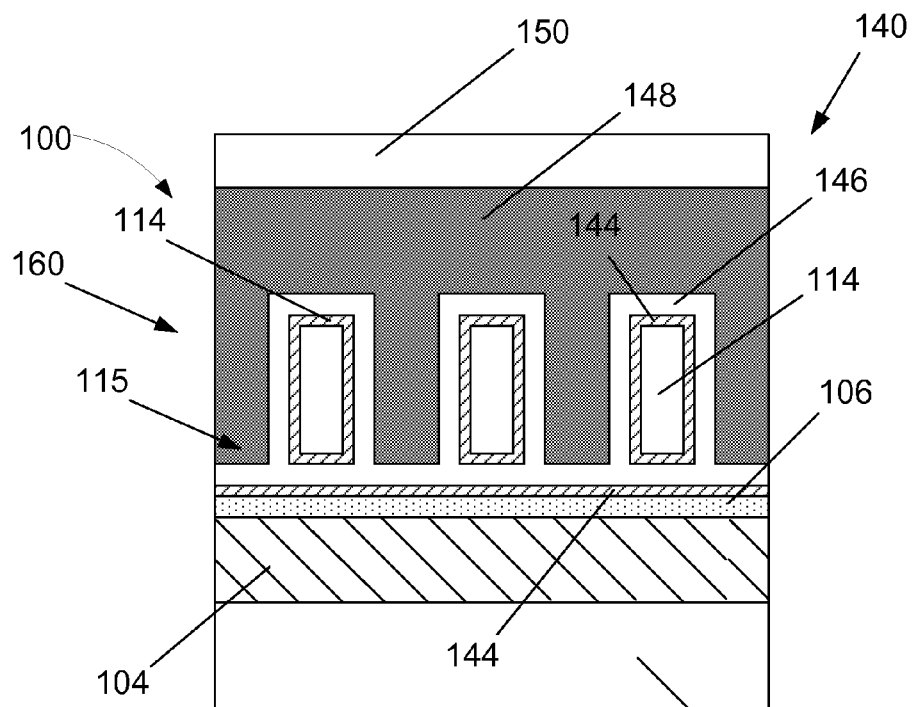
Figure 2Q:
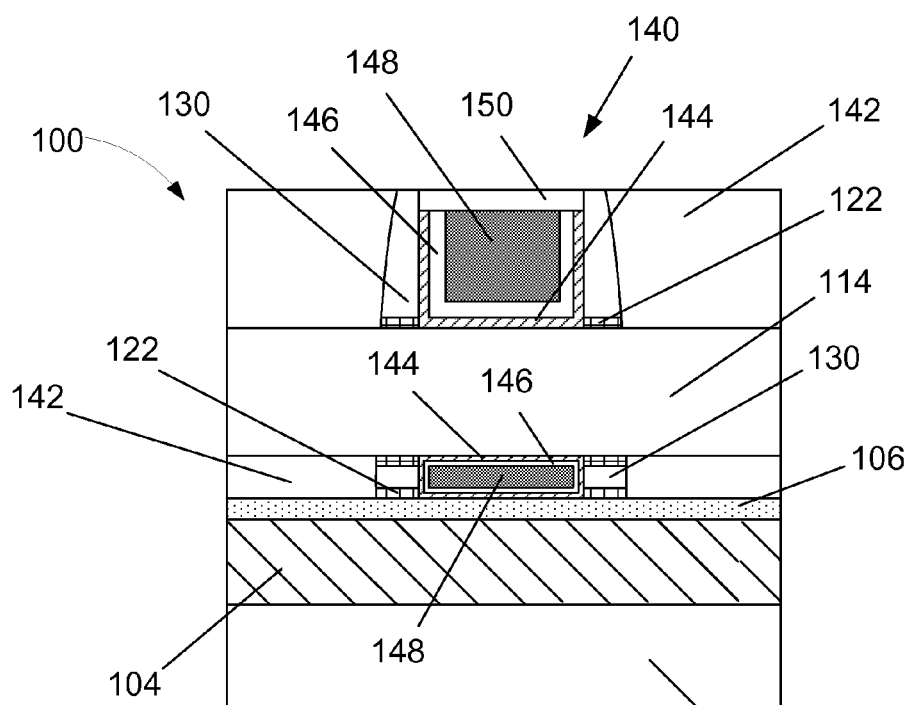

FIGS. 2A-2Q are cross-sectional views of an illustrative novel transistor device 100 disclosed herein as well as various illustrative methods disclosed herein of forming such devices. Some of the cross-sectional views are taken through the long axis of the fin, i.e., in the gate length or current transport direction when the device is operational (hereinafter the "gate length view"). Other cross-sectional views are taken through the long axis of the gate structure, i.e., in the gate width direction of the device (hereinafter the "gate width view").

FIG. 2A depicts the starting material for fabrication of the device 100. In general, a layer of insulating material 104 is positioned above a substrate 102 and a thin layer of a first semiconductor material 106 (e.g., up to about 15 nm or so in some applications) is positioned above the layer of insulating material 104. In one embodiment, both the substrate 102 and the semiconductor material 106 are made of silicon. The layer of insulating material 104 may be made of a variety of materials, such as silicon dioxide. The structure shown in FIG. 2A may be supplied in the form of an SOI-type structure from a vendor, or the structure may be manufactured using well-known processing techniques.

FIG. 2B depicts the device after a second layer of semiconductor material 108 and a third layer of semiconductor material 110 were formed above the first layer of semiconductor material 106. The materials selected for the layers 108, 110 as well as their individual thicknesses may vary depending upon the particular application. The layers 108, 110 may be formed by performing known epitaxial deposition processes. In one illustrative embodiment, the first and third layers of semiconductor material 106, 110 may be made of the same material, although such a situation is not required in all applications. In one particular embodiment, the second layer of semiconductor material 108 may be comprised of silicon germanium while the first and third layers of semiconductor material are comprised of silicon. In a more detailed example, the layer 106 may be a layer of silicon having a thickness of about 10 nm, the layer 108 may be a layer of $SiGe_{0.3}$ having a thickness that falls within the range of about 15-30 nm, and the layer 110 may be a layer of silicon having a thickness that falls within the range of about 30-50 nm.

FIG. 2C (gate width view) depicts the device 100 at the point of fabrication where an etching process was performed through a patterned masking layer (not show) to form a plurality of trenches 112 that define the basic fin structures 114 from the third layer of insulating material 110. The patterned masking layer has been removed in FIG. 2C. As depicted, the height of the fins 114 corresponds approximately to the thickness of the third semiconductor material layer 110. As depicted, the etching process stops in the second layer of insulating material 108. The lateral size or width, as well as the number of fins 114 of the device 100 may vary depending upon the particular application.

FIGS. 2D-2H will collectively be referenced to explain the next process operation. In the depicted example, the fins 114 were formed using well-known sidewall image transfer techniques wherein a sidewall spacer is formed around the perimeter of a line-shaped sacrificial mandrel that is later removed, thereby leaving the spacers as the mask layer. Accordingly, as depicted in FIG. 2D, at this stage of fabrication, adjacent fins 114 are connected at their ends by a U-shaped portion 114U (one example of which is shown within the dashed-line region 113).

The next process operation involves performing a wet etching process that removes the second layer of semiconductor material 108 selectively relative to surrounding structures and materials. Accordingly, FIG. 2E (plan view) depicts the formation of a patterned masking layer 120 (shown in dashed lines in FIG. 2E) over the connecting U-shaped end portions 114U of the fins 114 as well as a small portion of the axial length of the fins 114. FIG. 2F (gate width view), FIG. 2G (plan view) and FIG. 2H (side view taken through the long axis of a fin 114 where indicated in FIG. 2G) depict the device 100 after this wet etching process has been performed to selectively remove portions of the second layer of semiconductor material 108. As shown in FIGS. 2F and 2H, a space 115 is created between the fins 114 and the first layer of semiconductor material 106 that corresponds approximately to the thickness of the second layer of semiconductor material 108. However, with reference to FIGS. 2G-2H, due to the presence of the masking layer 120, portions of the second layer of semiconductor material 108 remain positioned under the U-shaped ends 114U. Due to the isotropic nature of the wet etching process, some of the second layer of semiconductor material 108 positioned under the masking layer 120 is removed during this etching process, as indicated by the dimension 122 in FIG. 2G. This etching process exposes the underlying first layer of semiconductor material 106 along substantially the entire length of the fins 114. Of course, those skilled in the art will appreciate that the fins 114 depicted in FIG. 2G span substantially the entire substrate (or a significant portion thereof) and that the fins 114 will later be cut to the desired axial length for the thousands or millions of such devices that will be formed above the substrate. Importantly, using the methods disclosed herein, composite pillar or support structures 130 are formed on opposite ends of the fins 114 due to the masking of the end portions of the fins 114 during the wet etching process described above. That is, the combination of the fin 114 and the remaining portion of the second layer of semiconductor material 108 define the support structures 130 that support the fins in subsequent manufacturing processes, wherein thousands of gate structures will be formed across the fins 114.

FIGS. 2I (gate width view) and 2J (gate length view) depict the device 100 after several operations were performed. More specifically, these drawings depict the device 100 after an illustrative and schematically depicted sacrificial gate structure 121 was formed for the device 100. In general, the sacrificial gate structure 121 is comprised of a sacrificial gate insulation layer 122, such as silicon dioxide, that is formed by performing a thermal growth process, and a sacrificial gate electrode 124, such as polysilicon or amorphous silicon. An illustrative gate cap layer 126 is also positioned above the sacrificial gate structure 121. A sidewall spacer 130 is formed adjacent the sacrificial gate structure 121. Also note the sacrificial gate insulation layer 122 is formed on the first layer of semiconductor material 106. The sacrificial gate structure 121 is intended to be representative in nature with respect to any type of material that may be employed in manufacturing integrated circuit products using so-called gate-last (replacement gate) manufacturing techniques. In one illustrative replacement gate manufacturing technique, the layers of material for the sacrificial gate structure including a gate cap layer are initially formed/deposited above the fins 114 and thereafter patterned using traditional masking and etching techniques to thereby define the sacrificial gate structure 121 with a gate cap layer 126 positioned above the sacrificial gate structure 121. At this point in the fabrication process, various doped regions, e.g., halo implant regions, extension implant regions and deep source/drain implant regions, would have been formed in the fins 114 and the first layer of semiconductor material 106 by performing various ion implantation processes and/or plasma doping process. However, so as not to obscure the present invention, such implant regions are not depicted in the attached drawings.

FIG. 2K is a cross-sectional view taken through the source/drain regions of the device where indicated in FIG. 2J. At some point after all of the various doping processes are performed, additional epi semiconductor material may be formed on the fins 114 and the first layer of semiconductor material 106 in the source/drain regions of the device 100 by performing known epitaxial deposition processes. Such additional epi material is not depicted in FIG. 2J but it is depicted in FIG. 2K. As shown therein, epi material 132 is formed on the fins 114 while epi material 134 is formed on the first layer of semiconductor material 106. These regions are depicted with different shading for purposes of explanation. In practice, in some regions, these two epi materials 132, 134 may merge together. The amount or thickness of the epi materials 132, 134 that is grown may vary depending upon the particular application. As depicted, in one embodiment, the epi material 132 that is formed on the fins 114 (the original shape of the fins is shown in dashed lines) has a diamond-shaped configuration, which is the result of the crystallographic orientation of the third layer of semiconductor material 110. As shown, in the device 100 disclosed herein, the epi material 134 may be grown to a substantial thickness without blocking off the area or space between adjacent regions of the diamond-shaped epi material 132.

FIGS. 2L (gate length view) and 2M (gate width view) depict the device 100 after several operations were performed. More specifically, these drawings depict the device 100 after a layer of insulating material layer 142, e.g., silicon dioxide, was blanket-deposited across the entire device 100, below the fin 114 and above the first layer of semiconductor material 106. So as not to obscure the presently disclosed inventions, the epi materials 132, 134 shown in FIG. 2K are not depicted in these drawings or any other drawings herein. Thereafter, a CMP process was performed to planarize the upper surface of the layer of insulating material 142 with the upper surface of the sacrificial gate electrode 124, which results in the removal of the gate cap layer 126. Thereafter, one or more etching processes were performed to remove the sacrificial gate structure 121, i.e., the sacrificial gate electrode 124 and the sacrificial gate insulation layer 122, which results in the formation of a replacement gate cavity 140 that is laterally defined by the spacers 130 where the final replacement gate structure for the device 100 will be formed.

FIGS. 2N (gate length view) and 2O (gate width view) depict the device 100 after a gate insulation layer 144 for the final gate structure was deposited within the gate cavity 140 on the fin 114 and the first layer of semiconductor material 106. As one specific example, the gate insulation layer 144 may be comprised of a high-k (k value greater than 10) material, such as hafnium oxide, that is deposited across the device 100 and within the gate cavity 140 by performing a conformal deposition process, i.e., an ALD or CVD deposition process.

FIGS. 2P (gate width view) and 2Q (gate length view) depict the device 100 after several operations were performed. More specifically, these drawings depict the device 100 after an illustrative work function adjusting metal layer 146 was formed on the gate insulation layer 144 by performing a conformal deposition process, i.e., an ALD or CVD deposition process. The thickness of the work function adjusting metal layer 146 may vary depending upon the particular application. Moreover, the material selected for the work function adjusting metal layer 146, as well as the number of such work function adjusting metal layers 146, may vary depending upon whether the device under construction is an NMOS or PMOS device. Thus, the work function metal adjusting layer 146 depicted in the drawings should be understood to represent one or more work function adjusting materials. Note that, due to the size of the spacing 115 between the bottom of the fin and the top of the first layer of semiconductor material 106, the work function adjusting metal layer(s) 146 fill the vertical space between the gate insulation layer 144 on the fins 114 and the gate insulation layer 122 on the first layer of semiconductor material 106.

With continuing reference to FIGS. 2P-2Q, also depicted are conductive gate materials 148 and a gate cap layer 150 that was formed in the gate cavity 140. Collectively, the gate insulation layer 144, the one or more work function adjusting metal layers 146 and the conductive gate materials 148 constitute a final replacement gate structure 160 for the device 100. Additionally, the one or more work function adjusting metal layers 146 along with any other conductive materials 148 that are part of the gate structure may be simply referred to as a conductive gate structure herein and in the claims. The replacement gate structure 160 depicted herein is intended to be representative in nature of any type of gate structure that may be employed in manufacturing integrated circuit products. Thus, the presently disclosed inventions should not be considered to be limited to any particular type of gate structure or the manner in which it is made.

Typically, in a replacement gate process flow, a pre-clean process will be performed in an attempt to remove all foreign materials from within the gate cavity 140 prior to forming the various layers of material that will become part of the final gate structure 160. For example, the gate structure 160 may be formed by sequentially depositing the materials of the gate structure 160 in the gate cavity 140 and above the layer of material 142, performing a CMP process to remove excess materials above the layer 142 and then performing an etch-back recess etching process such that the upper surface of the gate structure 160 is at the desired height level within the gate cavity 140. At that point, the material of the gate cap layer 150 may be deposited across the device and above the recessed gate structure 160, and another CMP process may be performed to remove excess material from above the layer of insulating material 142 so as to thereby define the gate cap layer 150. The conductive materials that are part of the gate materials 148 may include individual layers of metal and/or a bulk conductive material, such as tungsten or aluminum, that is deposited in the gate cavity 140. At this point in the process flow, traditional manufacturing operations may be performed to complete an integrated circuit product that includes the device 100, e.g., formation of source/drain and gate contacts, formation of various metallization layers, etc.

Figure 3A:
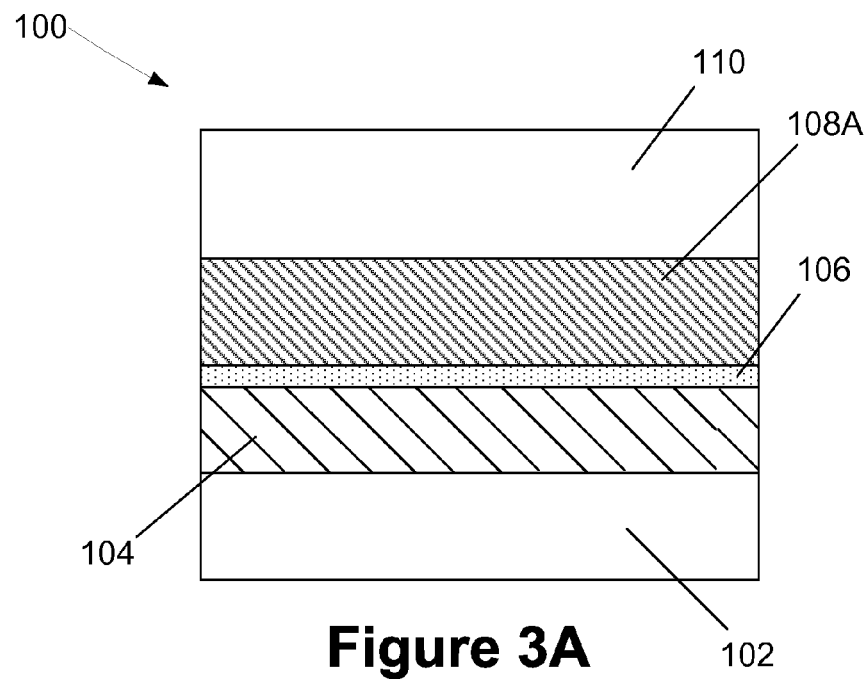
FIGS. 3A-3E depict yet other illustrative embodiments of a combination FinFET/Ultra-Thin Body (UTB) transistor device and various methods of making such devices.

FIGS. 3A-3E depict yet other illustrative embodiments of a combination FinFET/Ultra-Thin Body (UTB) transistor device and various methods of making such devices. FIG. 3A generally reflects the device 100 at a point in fabrication that corresponds to that depicted in FIG. 2B. However, in this embodiment, the second layer of semiconductor material 108A is made much thicker than the second layer of semiconductor material 108 shown in FIG. 2B. For example, the second layer of semiconductor material 108A may be about 5-100 nm thick.

Figure 3B:
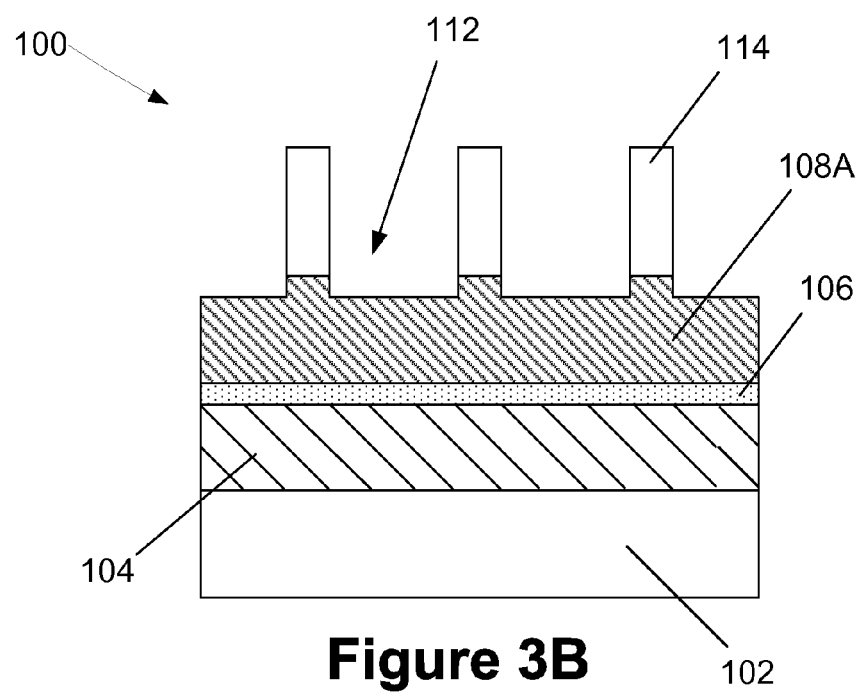

FIG. 3B generally reflects the device 100 at a point in fabrication that corresponds to that depicted in FIG. 2C, i.e., after an etching process was performed to form the trenches 112 that define the basic fin structures 114.

Figure 3C:
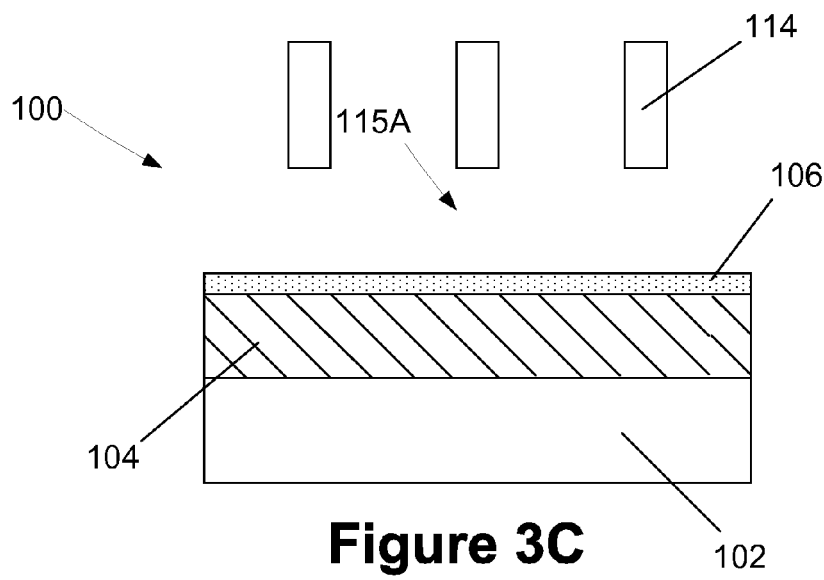

FIG. 3C generally reflects the device 100 at a point in fabrication that corresponds to that depicted in FIG. 2F, i.e., after the above-described wet etching process was performed to remove the second semiconductor material 108A selectively relative to surrounding structures and materials. This results in a space 115A between the bottom of the fins 114 and the top of the first layer of semiconductor material 106. Due to the increased thickness of the layer 108A as compared to the thickness of the layer 108, the space 115A is greater than the space 115 (see FIG. 2F).

Figure 3D:
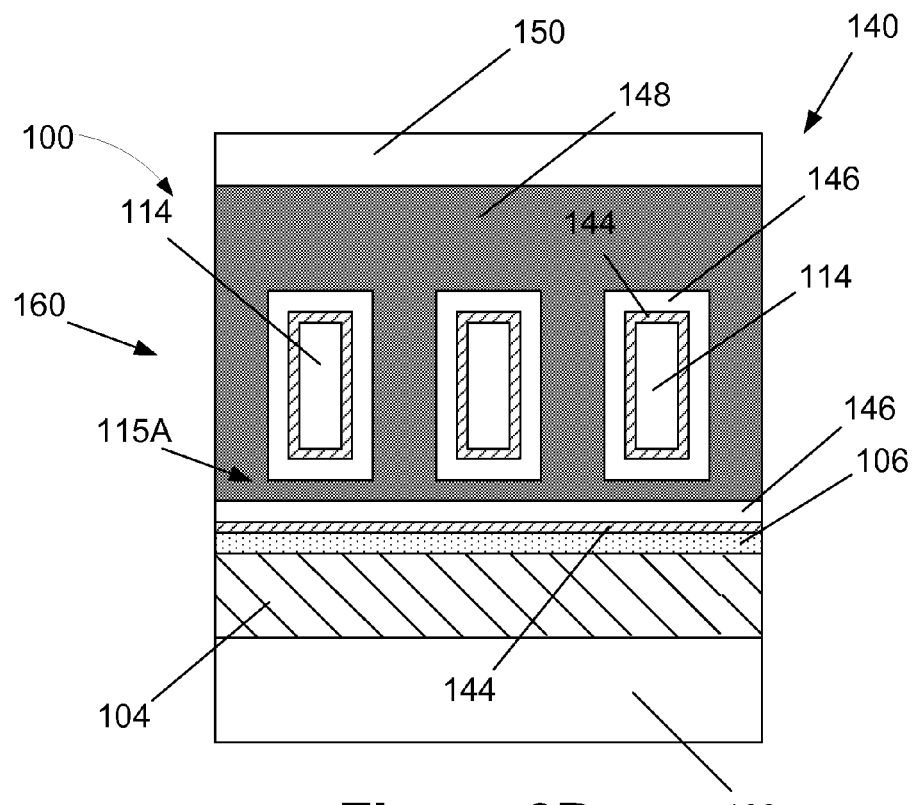
Figure 3E:
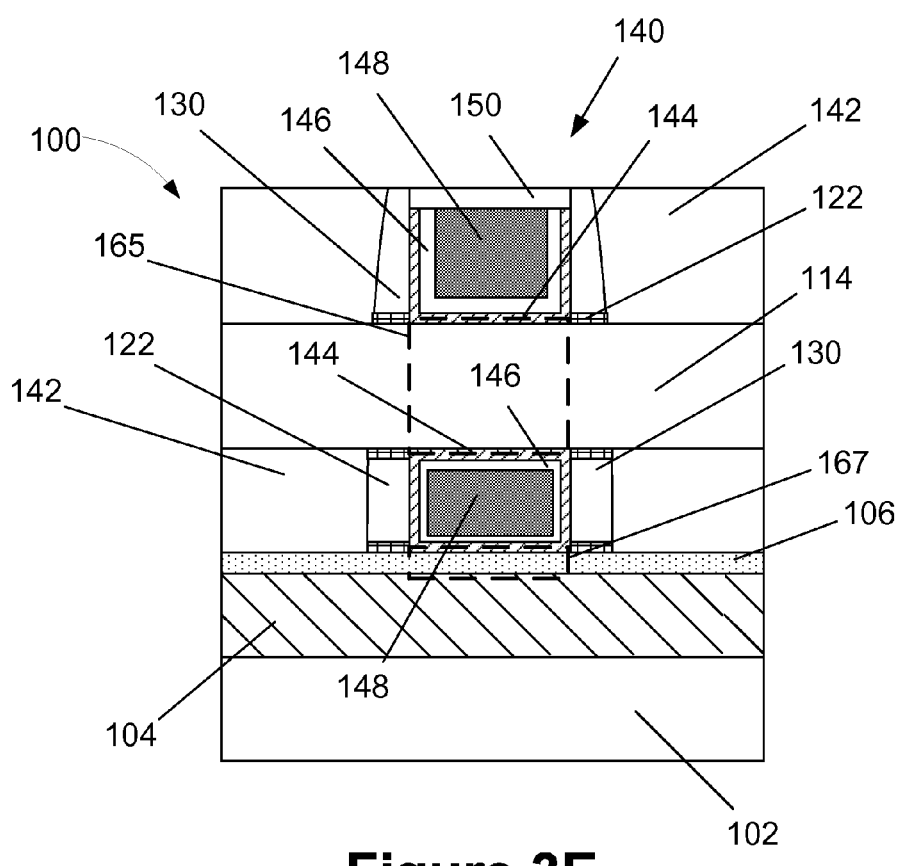

FIGS. 3D (gate width view) and 3E (gate length view) depict the device 100 after the formation of the above-described replacement gate structure 160 in the gate cavity 140 and the formation of the gate cap layer 150. However, unlike the embodiment shown in FIGS. 2P-2Q, due to the increased thickness 115A, the one or more work function metal layers 146 do not completely fill the space between the insulating material 144 on the bottom of the fin 114 and the insulating material 144 on the top of the first layer of semiconductor material 106. Rather, in this embodiment, a portion of the conductive gate material 148 is positioned vertically between the bottom of the fin 114 and the top of the first layer of semiconductor material 106.

As will be appreciated by those skilled in the art after a complete reading of the present application, the novel device disclosed herein is unique in many respects. First, the final gate structure 160 controls the channel region 165 (see FIG. 3E) through the fin 114 as well as the channel region 167 in the first layer of semiconductor material 106 positioned below the gate structure 160. Moreover, in forming the device herein, the wasted fin height (16X (FIG. 2B)) has been eliminated, thereby increasing drive current density. Other advantages and unique features of the methods and devices disclosed herein will be appreciated by those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A device, comprising:
   an active layer positioned above a layer of insulating material
   a fin positioned above said active layer;
   a gate insulation layer positioned on said active layer and on said fin;
   a conductive gate structure that is positioned around at least a portion of said fin and above at least a portion of said active layer, wherein said conductive gate structure comprises at least one work function adjusting metal layer positioned on said gate insulation layer;
   a first channel region defined in said fin under said conductive gate structure; and
   a second channel region defined in said active layer under said conductive gate structure.

2. The device of claim 1, wherein said conductive gate structure is positioned around an entire perimeter of said fin.

3. The device of claim 1, wherein said at least one work function adjusting metal layer completely fills a vertical space between a first portion of said gate insulation layer positioned adjacent said fin and a second portion of said gate insulation layer positioned adjacent an upper surface of said active layer.

4. The device of claim 1, wherein said at least one work function adjusting metal layer partially fills a vertical space between a first portion of said gate insulation layer positioned adjacent said fin and a second portion of said gate insulation layer positioned adjacent an upper surface of said active layer.

5. The device of claim 1, wherein said gate insulation layer is a high-k gate insulation layer.

6. The device of claim 1, wherein said conductive gate structure is comprised of one of tungsten or aluminum.

7. The device of claim 1, wherein said active layer and said fin are comprised of silicon.

8. The device of claim 1, wherein said conductive gate structure is positioned around an entire perimeter of said fin and between said fin and an upper surface of said active layer.

9. The device of claim 1, wherein said active layer has a thickness of 15 nm or less.

10. A method of forming a device in a structure comprising first, second and third layers of semiconductor materials positioned above a layer of insulating material, the method comprising:
    forming a plurality of trenches in at least said third layer of semiconductor material to thereby define a fin from said third layer of semiconductor material, said trenches exposing said second layer of semiconductor material;
    performing an etching process to selectively remove said second layer of semiconductor material relative to said first layer of semiconductor material and said fin;
    forming a gate insulation layer on said fin and on said first layer of semiconductor material; and
    forming a conductive gate structure around at least a portion of said fin and above at least a portion of said active layer, wherein said conductive gate structure comprises at least one work function adjusting metal layer positioned on said gate insulation layer and wherein a first channel region is defined in said fin under said conductive gate structure and a second channel region is defined in said first layer of semiconductor material under said conductive gate structure.

11. The method of claim 10, wherein forming said conductive gate structure comprises forming said conductive gate structure around an entire perimeter of said fin.

12. The method of claim 10, wherein forming said conductive gate structure comprises forming said conductive gate structure such that said at least one work function adjusting metal layer completely fills a vertical space between a first portion of said gate insulation layer positioned on said fin and a second portion of said gate insulation layer positioned on an upper surface of said first layer of semiconductor material.

13. The method of claim 10, wherein forming said conductive gate structure comprises forming said conductive gate structure such that said at least one work function adjusting metal layer partially fills a vertical space between a first portion of said gate insulation layer positioned on said fin and a second portion of said gate insulation layer positioned on an upper surface of said first layer of semiconductor material.

14. The method of claim 10, wherein said gate insulation layer is a high-k gate insulation layer.

15. The method of claim 10, wherein said conductive gate structure is comprised of one of tungsten or aluminum.

16. The method of claim 10, wherein said first layer of semiconductor material and said fin are made of silicon.

17. The method of claim 10, wherein said first layer of semiconductor material has a thickness of 15 nm or less.

18. The method of claim 10, wherein said first and third layers of semiconductor material are silicon and said second layer of semiconductor material is comprised of silicon germanium.

* * * * *